United States Patent
Kuroiwa

(10) Patent No.: US 7,935,232 B2
(45) Date of Patent: May 3, 2011

(54) SPUTTERING APPARATUS AND METHOD, AND SPUTTERING CONTROL PROGRAM

(75) Inventor: Shunji Kuroiwa, Kanagawa (JP)

(73) Assignee: Shibaura Mechatronics Corporation, Kanagawa (JP)

(*) Notice: Subject to any disclaimer, the term of this patent is extended or adjusted under 35 U.S.C. 154(b) by 935 days.

(21) Appl. No.: 11/628,138

(22) PCT Filed: Jun. 13, 2005

(86) PCT No.: PCT/JP2005/010772
§ 371 (c)(1),
(2), (4) Date: Nov. 29, 2006

(87) PCT Pub. No.: WO2005/121392
PCT Pub. Date: Dec. 22, 2005

(65) Prior Publication Data
US 2008/0023318 A1    Jan. 31, 2008

(30) Foreign Application Priority Data
Jun. 14, 2004 (JP) ................. 2004-175016

(51) Int. Cl.
*C23C 14/35* (2006.01)
(52) U.S. Cl. ........... 204/298.2; 204/298.19; 204/298.21; 204/298.22
(58) Field of Classification Search ........... 204/298.12, 204/298.2, 298.19, 298.22, 298.21
See application file for complete search history.

(56) References Cited

U.S. PATENT DOCUMENTS

| | | | | |
|---|---|---|---|---|
| 5,174,875 A | * | 12/1992 | Hurwitt et al. | 204/192.12 |
| 6,361,662 B1 | * | 3/2002 | Chiba et al. | 204/192.2 |

FOREIGN PATENT DOCUMENTS

| | | |
|---|---|---|
| JP | 02-290971 | 11/1990 |
| JP | 02-298263 | 12/1990 |
| JP | 08-144058 | 6/1996 |
| JP | 09-176852 | 7/1997 |
| JP | 10-060640 | 3/1998 |
| JP | 10-195649 | 7/1998 |
| JP | 2912864 | 4/1999 |
| JP | 2001-329362 | 11/2001 |
| JP | 2002-020866 | 1/2002 |

* cited by examiner

*Primary Examiner* — Nam X Nguyen
*Assistant Examiner* — Jason M Berman

(57) ABSTRACT

To provide a sputtering apparatus and method, and a sputtering control program which are configured simply and can secure the uniformity of the film thickness from the beginning to the end of the use of a target.

There are provided: a target 15 disposed so as to face an object to be treated 19; a permanent magnet unit M which generates a high-density plasma by means of a magnetic field and deposits a material of the target 15 on the object to be treated, in the form of a film; a rotational mechanism 9 which rotates the permanent magnet unit M; and a rotation number control apparatus 7 which gradually changes the number of rotations of the permanent magnet unit M rotated by the rotational mechanism 9. The rotation number control apparatus 7 has a rotation number setting section 702b for setting the number of rotations to be switched, a switching time setting section 702a for setting the time for switching, a detection section 703 for detecting the switching time, a selecting section 704 for selecting the number of rotations at the switching time, and a switching section 705 for outputting an instruction of switching to the selected number of rotations.

4 Claims, 8 Drawing Sheets

SPUTTERING APPARATUS AND METHOD, AND SPUTTERING CONTROL PROGRAM

TECHNICAL FIELD

The present invention relates to a sputtering apparatus and method, as well as a sputtering control program for depositing a reflective film, permeable film, or other thin film made from metal or an insulator, on a surface of an object to be treated by means of, for example, a sputter source.

BACKGROUND ART

Recently, in a manufacturing process for producing various products such a semiconductor device, liquid crystal display, or optical disk, there has been widely used a sputtering deposition apparatus (referred to as "sputtering apparatus" hereinafter) for depositing a thin film of various types on an object to be treated such as a wafer, glass substrate, polycarbonate substrate, or the like. In such a sputtering apparatus, a predetermined deposited material as a target, which is provided inside a vacuum container, is biased to the cathode beforehand, and ions of discharge gas such as argon (Ar) are collided with the target, whereby the desorbed material of an atom, molecule or cluster, from the material configuring the target, is deposited as a thin film on an object to be treated.

In such a sputtering apparatus, a so-called "magnetron sputtering system" is widely used in order to increase the sputtering speed by increasing the density of plasma obtained by glow discharge in a space in the vicinity of the surface of the target. In the magnetron sputtering system, a magnet unit is provided on the back of the target (the side opposite from the object to be treated), and charged particles are confined in the vicinity of the surface of the target by using a magnetic field generated from the magnet unit, whereby high plasma density is obtained. By increasing the plasma density in this manner, sputtering can be performed at high speed, and the speed of deposition performed on the object to be treated can be increased.

Incidentally, the target in the magnetron sputtering apparatus is a film material, thus the target is naturally scraped and thinned as the object to be treated is processed. Such a phenomenon is caused on the surface of the target facing the object to be treated, and such a phenomenon hardly occurs in the beginning of the use of the target and gradually progresses as the number of processes performed on the object to be treated increases. Therefore, if the usage of the target increases, in other words, if the number of processes performed on the object to be treated increases, the distance between the surface of the target and the object to be treated increases, while the distance between the magnet unit and the surface of the target decreases.

In this manner, if the distances of the surface of the target to the object to be treated and the magnet unit change between the beginning and end of the use of the target, the positional relations of the generated magnetic field to the surface of the target and the object to be treated change, thus the uniformity of the thickness of the film deposited on the object to be treated also changes. Specifically, even if the uniformity of the film thickness is good in the beginning of the use of the target, the problem is that the uniformity of the film thickness worsens in the end of the use of the target. Especially in the case where the object to be treated is a substrate for a liquid crystal display or optical disk, the film thickness is preferably uniform for all products, but if the uniformity deteriorates because of the decrease of the target, the production yield is affected by such phenomenon.

As a method of achieving uniformity of the film thickness in each substrate, for example, there is proposed in Japanese Patent Application Laid-Open No. H10-195649 a technology of forming a uniform film by rotating a magnet by a preset optimum number of rotations in accordance with the material of the target and required quality. Further, Japanese Patent Application Laid-Open No. H8-144058 proposes a technology for forming a uniform film on a rectangular substrate or the like by adjusting a rotation velocity distribution of each of a plurality of magnets. Japanese Patent Application Laid-Open No. 2001-329362 proposes a technology of inhibiting fluctuation of the number of rotations, which is caused by eddy current, and forming a uniform film by using an excellent backing plate material for supporting the target. However, these technologies do not focus on scraping of the target which occurs over time, and thus cannot prevent gradual deterioration of the uniformity of the film thickness in the products which are successively produced between the beginning and end of the use of the target.

As a conventional technology which focuses on such scraping of the target, there are Japanese Patent No. 2912864, Japanese Patent Application Laid-Open No. H9-176852 and Japanese Patent Application Laid-Open No. H10-60640. Specifically, Japanese Patent No. 2912864 and Japanese Patent Application Laid-Open No. H9-176852 are technologies of separating the entire or a part of a permanent magnet unit from a target, and thereby changing the distribution and intensity of a magnetic field on the surface of the target, as well as the position of the magnetic field which is parallel to the target, to secure uniformity of the film thickness from the beginning to the end of the use of the target. Moreover, Japanese Patent Application Laid-Open No. H10-60640 is a technology which is capable of maintaining a fixed film-formation condition by adjusting the exciting electric power to a rotating electromagnetic coil in accordance with the condition of erosion caused on the surface of the target over time.

However, the technologies of Japanese Patent No. 2912864 and Japanese Patent Application Laid-Open No. H9-176852 require not only a mechanism for rotating the permanent magnet unit but also a mechanism for moving the permanent magnet unit up and down to adjust the distance thereof to the target, thus the apparatus becomes complicated and the costs are increased. Moreover, in the technology of the Japanese Patent Application Laid-Open No. H10-60640, provision of the rotating electromagnetic coil complicates the apparatus and increases the costs, and it is extremely troublesome to adjust the exciting electric power to be supplied to the electromagnetic coil to an optimum value.

On the other hand, there are the following difficulties in applying the technologies described in Japanese Patent Application Laid-Open No. H10-195649, Japanese Patent Application Laid-Open No. H8-144058 and Japanese Patent Application Laid-Open No. 2001-329362 to the problem of scraping of the target which occurs over time. Specifically, in Japanese Patent Application Laid-Open No. H10-195649 the number of rotations of the magnet is merely controlled by a fixed number of rotations in accordance with the material and the like of the target, thus even in the case of a target made of the same material, when the distance between the target and the magnet unit or the like is changed because of scraping of the target, increasing unevenness of the film thickness between the products cannot be treated.

Furthermore, in Japanese Patent Application Laid-Open No. H8-144058, it is necessary to provide a plurality of magnets which rotate individually, thus the apparatus becomes complicated and the costs are increased. Also, control is merely performed by adjusting a predetermined rotation velocity distribution of each of the rotating magnets in accordance with the rectangular substrate or the like, thus when the distance between the target and the magnet unit or the like is changed because of scraping of the target, increasing unevenness of the film thickness between the products cannot be treated. Moreover, Japanese Patent Application Laid-Open No. 2001-329362 inhibits fluctuation of the number of rotations of the magnet, which is caused by eddy current, and forms a uniform film by selecting a material for a backing plate, thus the change in the distance between the target and the magnet unit or the like, which us caused by scraping of the target as described, above cannot be treated.

The present invention is therefore contrived in order to solve the problems of the above-described conventional technologies, and an object of the present invention is to provide a sputtering apparatus and method, and a sputtering control program which are configured simply and can secure the uniformity of the film thickness from the beginning to the end of the use of a target.

DISCLOSURE OF THE INVENTION

In order to achieve the above object, the present invention is a sputtering apparatus having: a target which is disposed so as to face an object to be treated; a magnet unit which is provided rotatably on the back of the target, generates a high-density plasma by means of a magnetic field generated with rotation, and deposits a material of the target on the object to be treated, in the form of a film; and a rotational mechanism which rotates the magnet unit, wherein a control apparatus, which gradually changes the number of rotations of the magnet unit between the beginning and end of the use of the target, is connected to the rotational mechanism.

In a preferred aspect, in a sputtering method of depositing, on the object to be treated, in the form of a film, the constituent material of the target disposed so as to face the object to be treated, by generating a high-density plasma by means of the magnetic field which is generated by the magnet unit rotated by the rotational mechanism, the number of rotations of the magnet unit rotated by the rotational mechanism is gradually switched during a time period between the beginning and end of the use of the target.

In a preferred aspect, in a sputtering control program for controlling by a computer the rotational mechanism which rotates the magnet unit disposed on the back of the target for sputtering, the number of rotations of the magnet unit is gradually changed by controlling the rotational mechanism between the beginning and end of the use of the target.

In the above aspects, even if the distances of a surface of the target to the object to be treated and the magnet unit are changed, the characteristics of the magnetic field are changed by gradually changing the number of rotations of the magnet unit, whereby the thickness of the film to be formed can be kept uniform.

In a preferred aspect, the control apparatus has: a drive section which drives the rotational mechanism; a detection section which detects a measurement value indicating the use time or the usage of the target; a setting section which sets a plurality of number of rotations corresponding to the measurement value; a selecting section which selects the number of rotations set by the setting section, in accordance with the measurement value detected by the detection section; and a switching section which instruct the drive section to switch to the number of rotations selected by the selecting section.

In a preferred aspect, the computer is caused to detect the measurement value indicating the use time or the usage of the target, set the plurality of number of rotations corresponding to the measurement value, select the set number of rotations in accordance with the detected measurement value, and output an instruction for switching to the selected number of rotations.

In the above aspects, although the target wears out as the use time or the usage increases, the number of rotations is switched automatically at appropriate timing by previously setting the number of rotations in response to the wear of the target, hence the film thickness can be kept uniform from the beginning to the end of the use of the target.

In a preferred aspect, in the setting section a small number of rotations is set as the use time or the usage of the target increases.

In a preferred aspect, the number of rotations of the magnet unit is switched from a large number of rotations to a small number of rotations as the use time or the usage of the target increases.

In the above aspects, a large number of rotations which is optimum in the beginning of the use of the target is not kept constant until the end of the use of the target but is switched gradually to a small number of rotations, whereby deterioration of the uniformity of the film thickness, which is caused by wear of the target when the number of rotations is fixed, can be prevented from occurring.

According to the present invention, a sputtering apparatus and method, and a sputtering control program which are configured simply and can secure the uniformity of the film thickness from the beginning to the end of the use of the target.

BEST MODE FOR CARRYING OUT THE INVENTION

Hereinafter, an embodiment of the present invention (referred to as "embodiment" hereinafter) is described specifically with reference to the drawings.

[Configuration]

Figure 1:
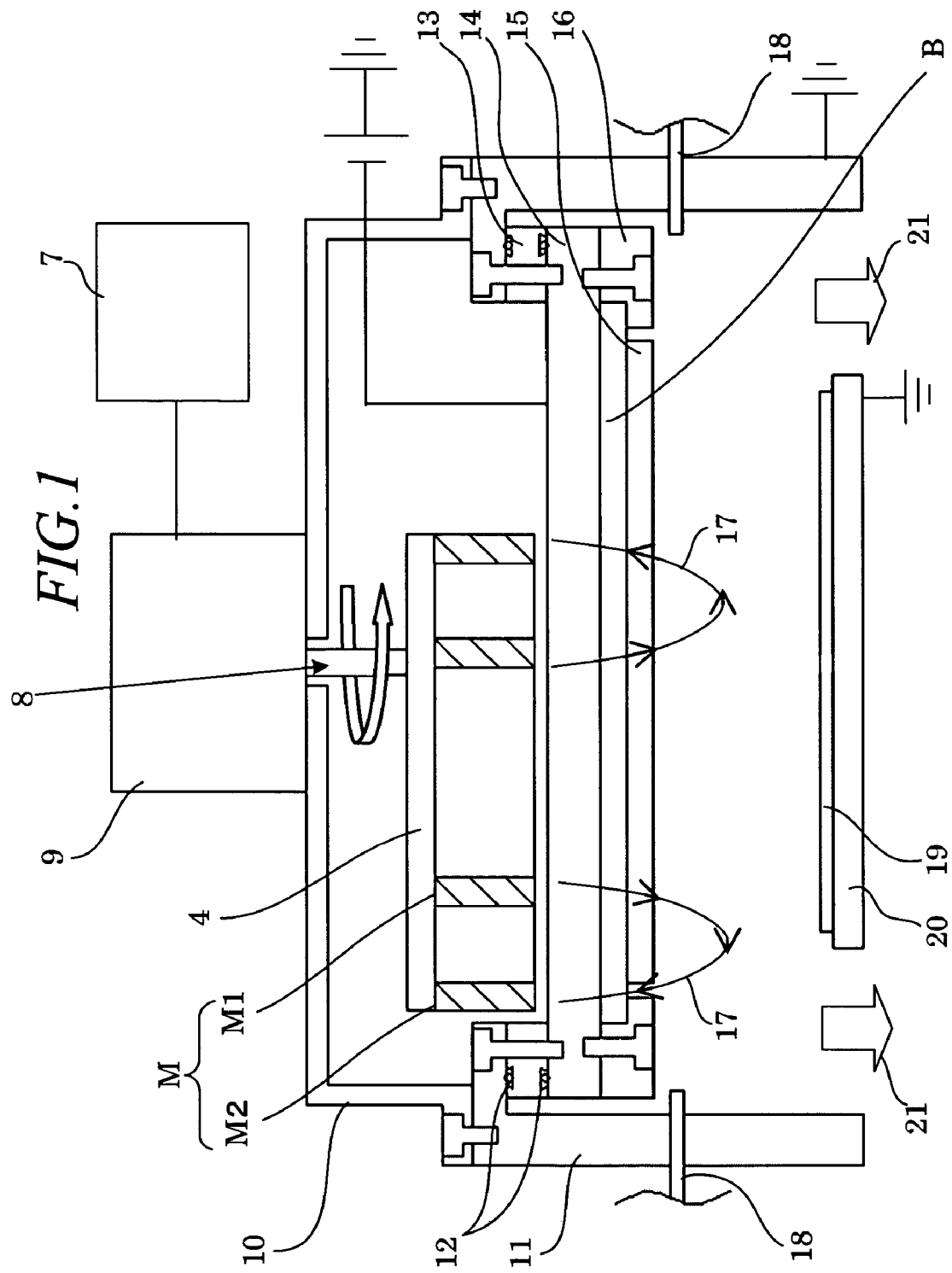
[FIG. 1] A simplified configuration diagram showing an embodiment of the present invention.

First, a configuration of a sputtering apparatus of the present embodiment (referred to as "present apparatus" hereinafter) is described with reference to FIG. 1. Specifically, the present apparatus has a vacuum chamber 11, supporting base 20, target 15, housing 10, permanent magnet unit M, and the like, as shown in FIG. 1. The vacuum chamber 11 is configured so as to be able to maintain a reduced-pressure atmosphere by means of a vacuum pumping system 21. Moreover, the vacuum chamber 11 is provided with a gas feed port 18 for introducing sputtering gas. The supporting base 20 is a base disposed within the vacuum chamber 11, and has mounted thereon an object to be treated 19 such as a wafer or substrate which is a target of film formation.

In an upper part of the supporting base 20 within the vacuum chamber 11, the target 15 is disposed in a position facing the object to be treated 19 on the supporting base 20. This target 15 is a member made of a film material, and fixedly supported within the vacuum chamber 11 via a cooling mechanism 14 and a backing plate B. The cooling mechanism 14 is a mechanism which is provided with water passage or the like (not shown) in which cooling water or the like for cooling the target 15 can flow, and is attached to the vacuum chamber 11 via an insulating ring 13 which isolates the target 15 in order to apply bias voltage. Also, an O-ring 12 for maintaining the airtightness of the vacuum chamber 11 is provided between the insulating ring 13 and the vacuum chamber 11 and between the insulating ring 13 and the cooling mechanism 14.

The backing plate B is attached to a lower part of the cooling mechanism 14 by means of a target holding member 16, whereby the target 15 is fixed to the backing plate B. The backing plate B is preferably a disk-like or circular member having good electrical conductivity so as to generate, in the target 15 or a periphery thereof, a flow path of eddy current caused by a change of a magnetic field.

Also, the housing 10 is attached to an upper part of the vacuum chamber 11, and the permanent magnet unit M is disposed inside of the vacuum chamber 11 (back of the target 15). The permanent magnet unit M is obtained by fixing double circular magnets, an inner magnet unit M1 and outer magnet unit M2, to a magnet attachment plate 4, and is configured so as to be rotated off-center of a rotation axis 8 by a rotational mechanism 9 such as a motor attached to an upper part of the housing 10. Therefore, the permanent magnet unit M is configured to generate a magnetic field in a space in the vicinity of the surface of the target 15, while rotating off-center.

The rotational mechanism 9 is configured such that the number of rotation thereof is controlled by a rotation number control apparatus 7. The rotation number control apparatus 7 changes the number of rotations of the rotational mechanism 9 at predetermined timing between the beginning and end of the use of the target 15. Basically, this control is to change a fixed speed (number of rotations N1) in the beginning of the use (0) to a slower fixed speed (number of rotations N2) at time (t1) before the end of the usage (t2). The rotation number control apparatus 7 can be realized by a computer or the like which is operated by a special electronic circuit or a predetermined program.

Figure 2:
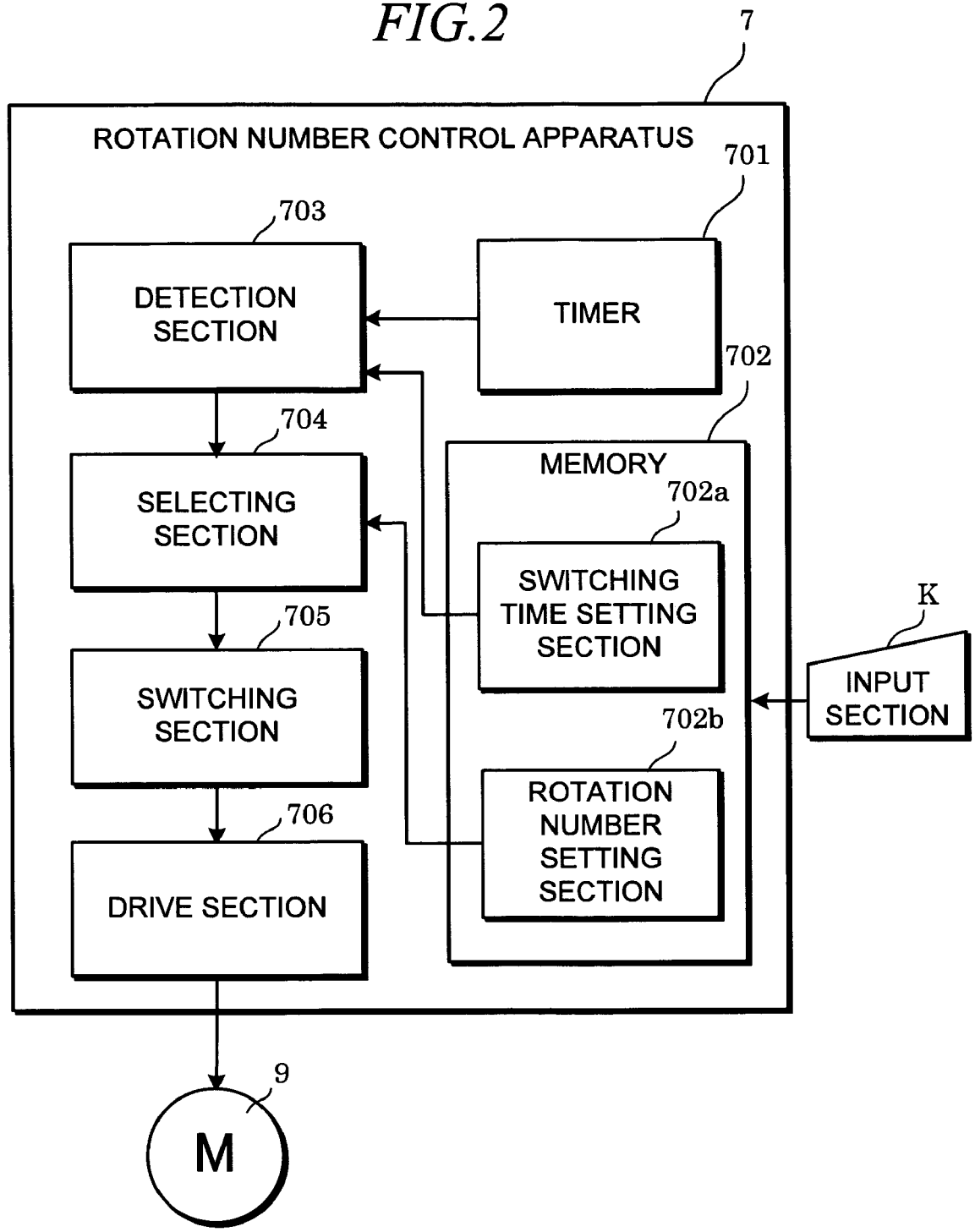
[FIG. 2] A functional block diagram showing a rotation number control apparatus in the embodiment of FIG. 1.

Therefore, the rotation number control apparatus 7 can be configured in, for example, a manner shown in a virtual functional block of FIG. 2. Specifically, the rotation number control apparatus 7 has a timer 701, memory 702, detection section 703, selecting section 704, switching section 705, and drive section 706. The timer 701 is means for measuring time. The memory 702 is means for storing various settings and has a switching time setting section 702a for setting the time for switching the speed, and a rotation number setting section 702b for setting the initial rotation number and the number of rotations corresponding to each switching time. The detection section 703 is means for detecting that the time measured by the timer 701 is the time set by the switching time setting section 702a. The selecting section 704 is means for selecting the corresponding number of rotations when the detection section 703 detects that the switching time has been reached. The switching section 705 is means for outputting an instruction of switching to the number of rotations selected by the selecting section 704. The drive section 706 is a driver for driving the rotational mechanism 9 by the number of rotations set by the rotation number setting section 702b. Moreover, the drive section 706 performs switching to the instructed number of rotations when a switching instruction is issued from the switching section 705.

The specific switching time or the number of rotations can be set freely in accordance with the object to be treated 19, but in the present apparatus the number of rotations at the time of the beginning of the use of the target 15 t0 [s] is taken as N1 [rpm] which is suitable for initial sputtering, and the number of rotations at the time t1 [s] until the end time t2 [s] is switched to the number of rotations N2 [rpm] (N1>N2). For the switching time or the number of rotations, an appropriate value obtained in an experiment or the like may be set by default beforehand, or a user may input a desired value by means of an input section K such as a keyboard, touch panel, and switch. The switching time or the number of rotations may be inputted by selecting from a menu of an interface which is prepared beforehand. In this case, any of typical set values may be selected, or an appropriate numerical value may be set automatically by simply selecting, instead of a numerical value, a specified condition such as the type of the object to be treated 19, material of the target 15, or the like. It should be noted that a computer program, which controls the operation of the present apparatus through a procedure described hereinafter, and a recording medium recording the computer program are in an aspect of the present invention.

[Operation]

The above-described operation of the present apparatus is described next. First of all, the switching time and the number of rotations are previously set in the switching time setting section 702a and the rotation number setting section 702b as described above. Then, the object to be treated 19 is mounted on the supporting base 20, and the vacuum chamber 11 is exhausted. Thereafter, predetermined sputtering gas such as argon (Ar) is introduced from the gas feed port 18. The drive section 706 of the rotation number control apparatus 7 drives the rotational mechanism 9 by the number of rotations which is set beforehand as the initial rotation number by the rotation number setting section 702b, thus the permanent magnet unit M is rotated at this number of rotations.

Predetermined negative voltage is biased to the target 15 while rotating the permanent magnet unit M. Consequently, a high-density plasma is generated in the vicinity of the surface of the target 15 by a magnetic tunnel formed in a magnetic field 17 by the permanent magnet unit M. Then, charged particles thus generated are collided with the target 15 to which the negative voltage is biased, whereby the material of the target 15 is obtained and deposited on the objected to be treated 19 in the form of a thin film.

In the sputtering apparatus such as the present apparatus, in response to the number of rotations of the permanent magnet unit M, eddy current is generated in the target 15 or in a member with electric conductivity around the target 15, in a direction of negating the change in the magnetic field. As a result, when the number of rotations of the permanent magnet unit M is changed, the distribution and intensity of the magnetic field on the surface of the target 15, as well as the position of the magnetic field which is parallel to the target 15 can be controlled. Specifically, by changing the number of rotations of the permanent magnet unit M and changing the characteristics of the magnetic field, the distribution of the sputtering rate on the surface of the target 15 can be changed, and thereby the distribution of the thickness of the film deposited on the object to be treated 19 can be controlled.

Figure 3:
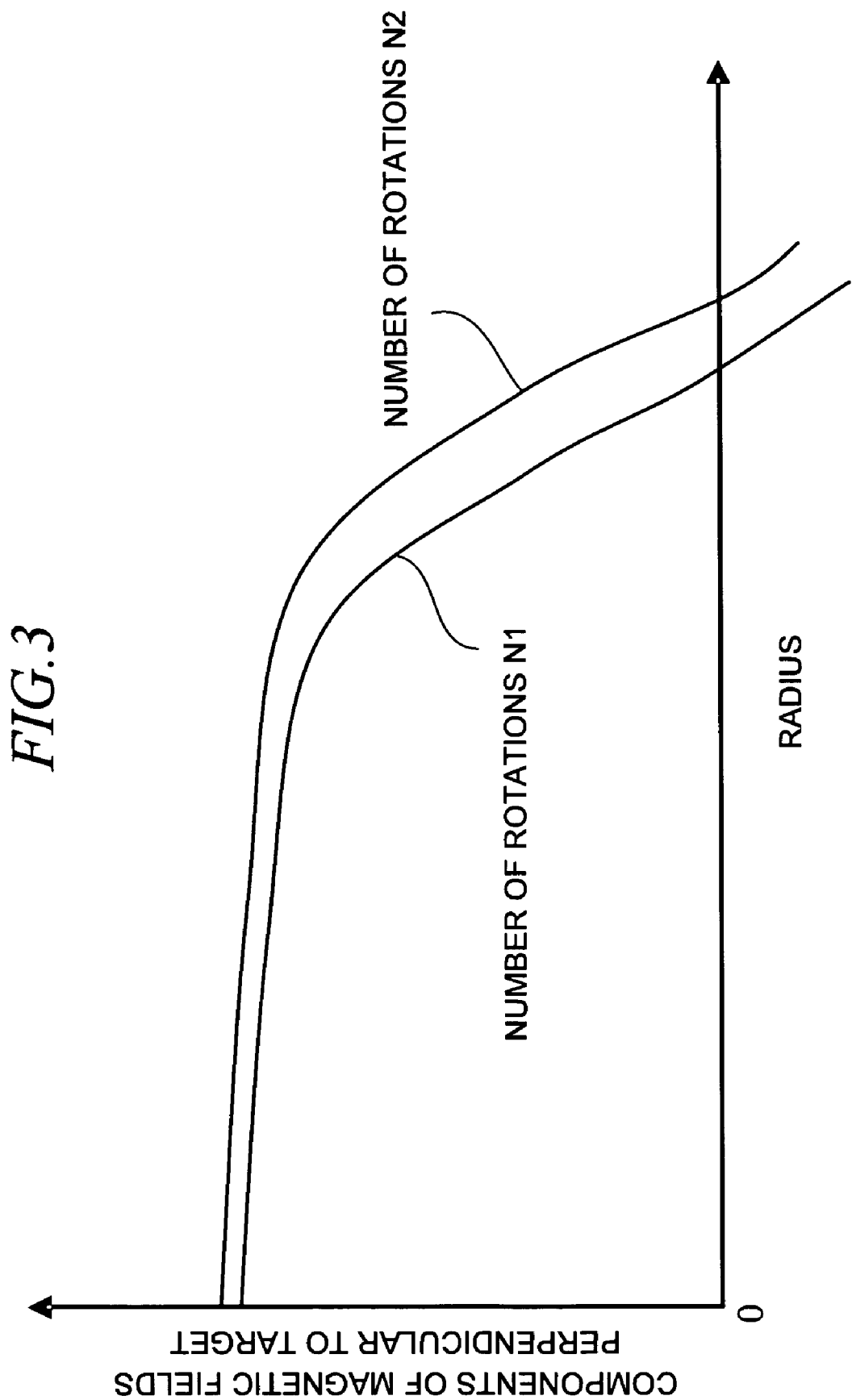
[FIG. 3] An explanatory diagram showing differences in the components of magnetic fields perpendicular to a target, with respect to the number of rotations.

For example, as shown in FIG. 3, the components of magnetic fields perpendicular to the target 15 and right above the target 15 are different in the case where the target 15 is rotated at the number of rotations N1 and in the case where the target 15 is rotated at the number of rotations N2 (N1>N2). Due to such difference in the magnetic field components, the eddy current flowing in the cooling mechanism 14, target 15, target holding member 16, and the periphery of these members changes, and as a result a different synthetic magnetic field is created by the permanent magnet unit M and the eddy current.

Figure 4:
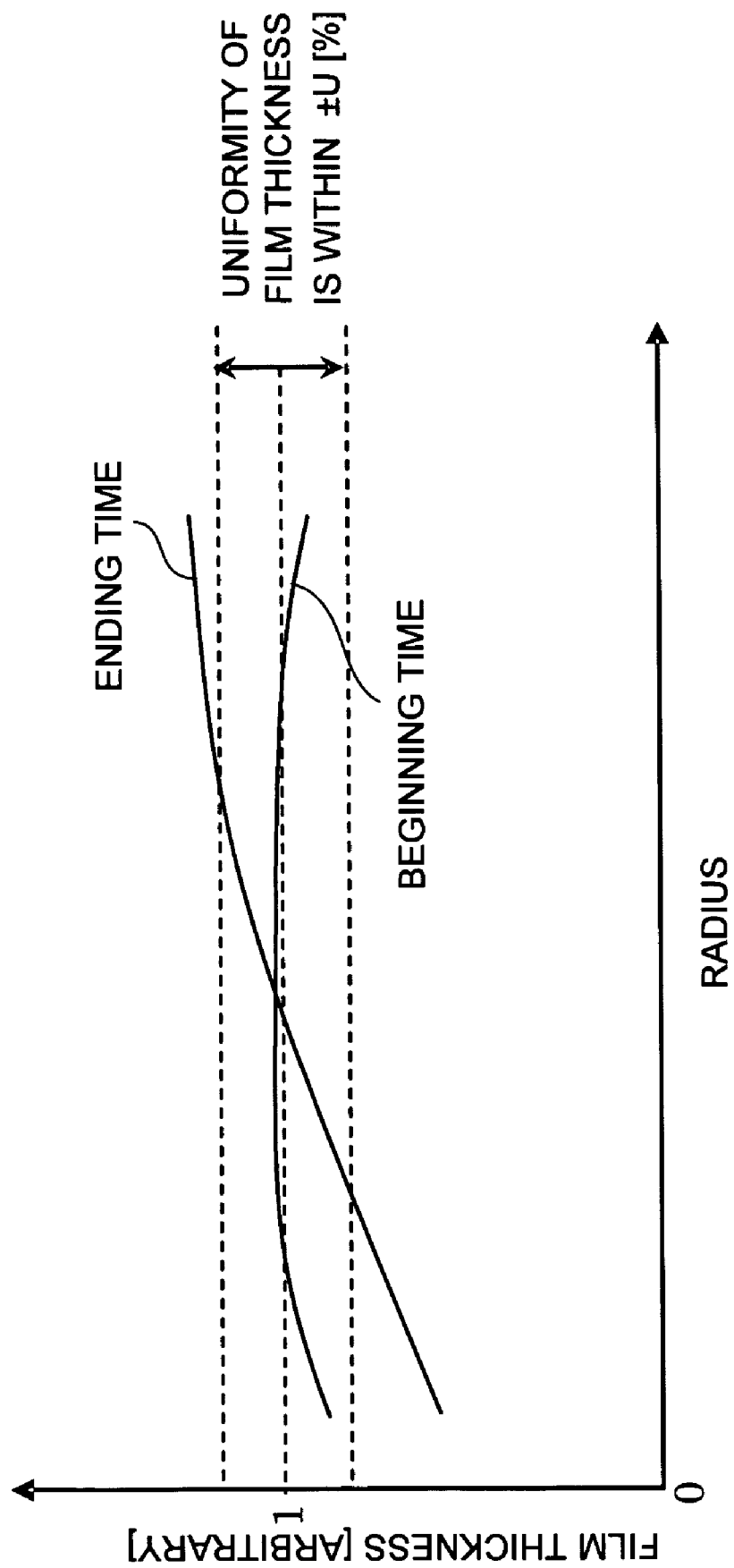
[FIG. 4] An explanatory diagram showing differences in the uniformity of the film thickness in the beginning and the end of the use of the target when the number of rotations is fixed.

Here, FIG. 4 shows the distribution of the thickness of the film deposited on the object to be treated, in the beginning and the end of the use of the target, in the case where sputtering is carried out at the fixed number of rotations N1 from the beginning to the end of the use of the target 15 as in the prior art. In this case, since the magnetic field is fixed with respect to the time, the distance between the surface of the target 15 and the object to be treated 19 and the distance between the permanent magnet unit M and the surface of the target 15 are changed as the target is scraped, thus the thickness of the film deposited on the object to be treated 19 is also different significantly between the beginning and the end of the use of the target 15.

Figure 5:
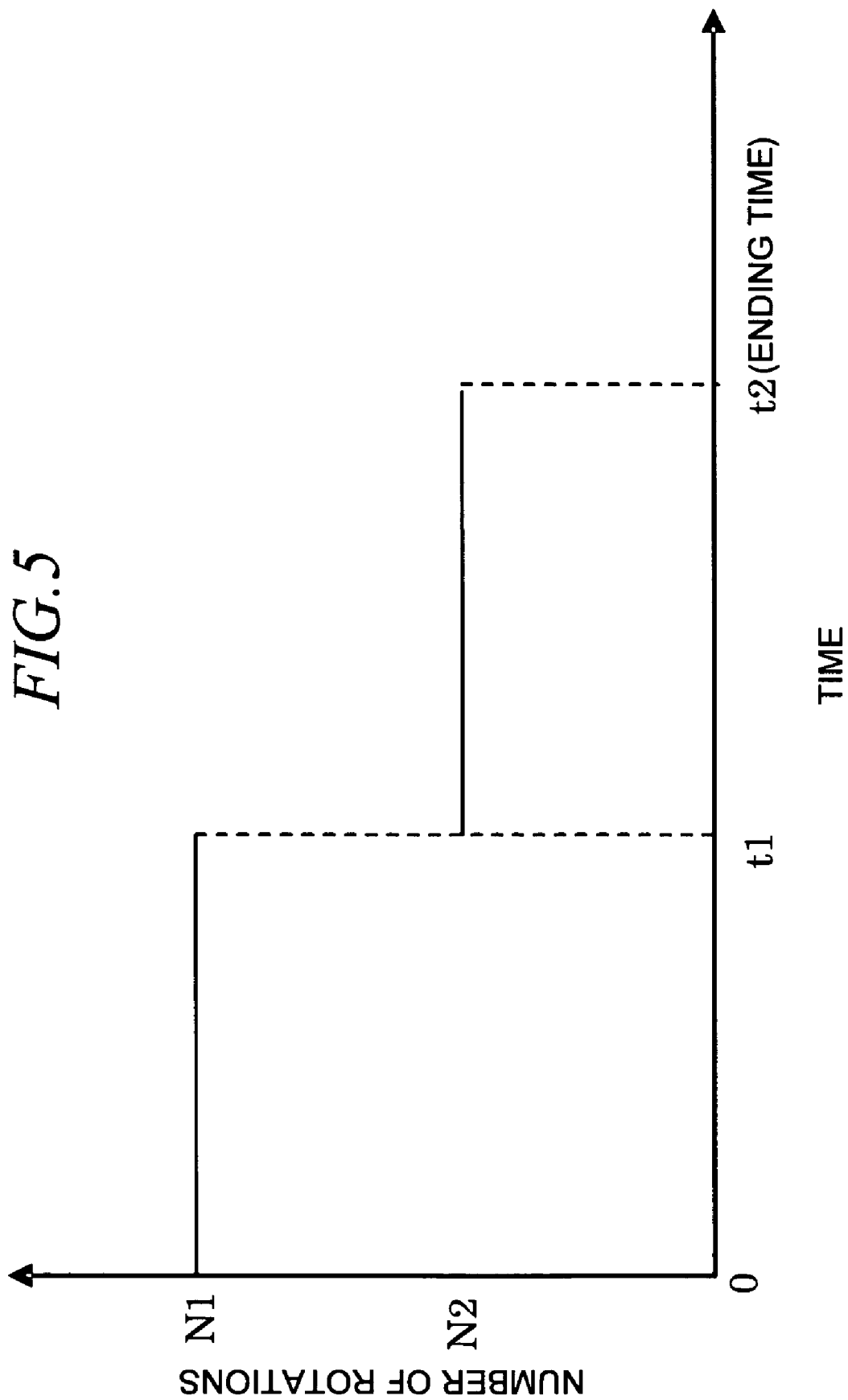
[FIG. 5] An explanatory diagram showing a state in which the number of rotations is switched in accordance with the passage of time in the embodiment of FIG. 1.

On the other hand, in the present apparatus, when the detection section 703 detects that the time measured by the timer 701 becomes the time t1 which is set by the switching time setting section 702a, the selecting section 704 selects the number of rotations N2, and the switching section 705 instructs the drive section 706 to switch to the number of rotations N2. Therefore, as shown in FIG. 5, the drive section 706 switches the number of rotations for the drive of the rotational mechanism 9 from the number of rotations N1 to the number of rotations N2.

Figure 6:
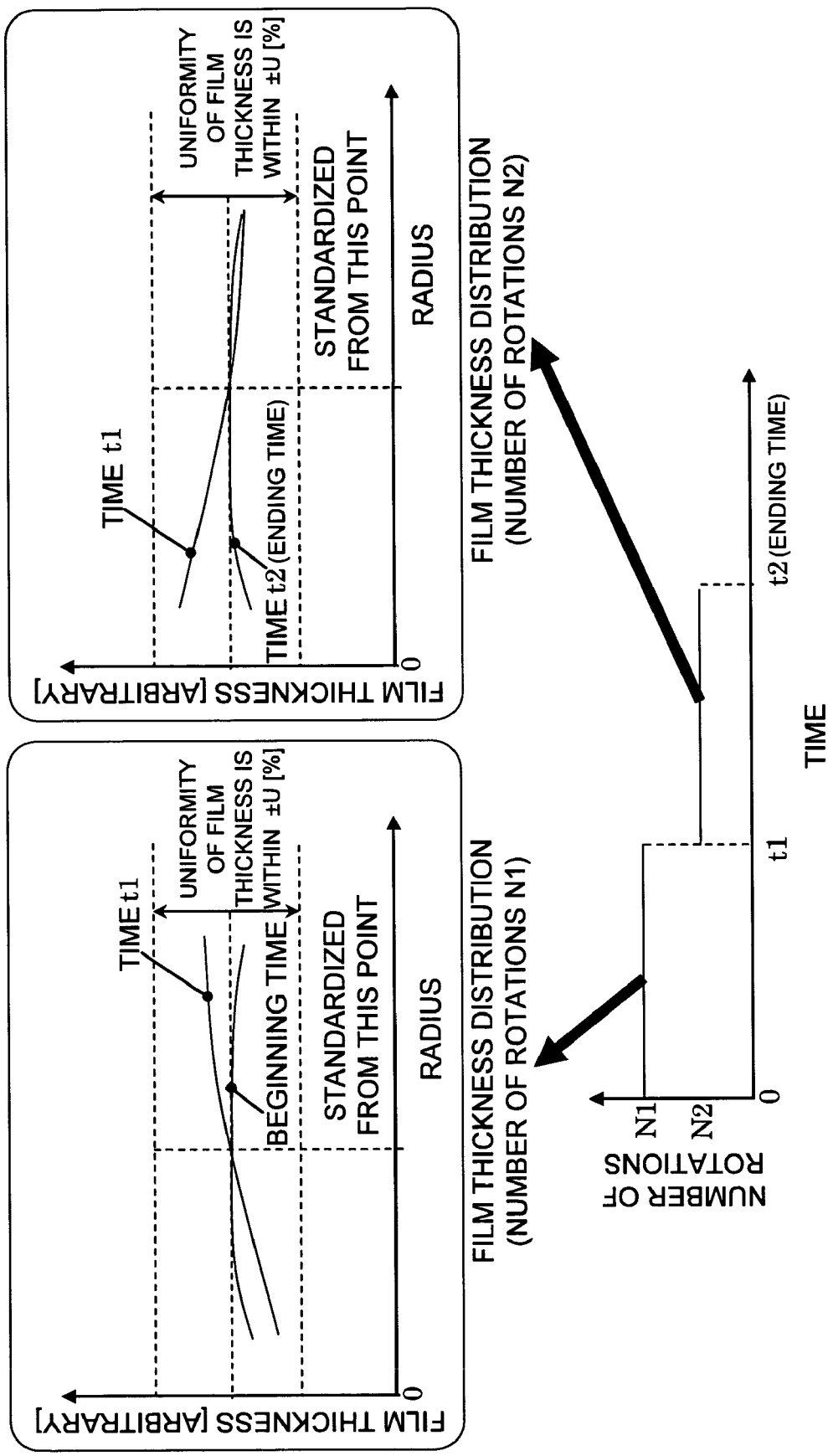
[FIG. 6] An explanatory diagram showing a state of keeping the uniformity of the film thickness obtained before and after switching the number of rotations in the embodiment of FIG. 1.

In this manner, when the number of rotations is changed from N1 to N2, the distribution of the film thickness is changed as shown in FIG. 6. Specifically, the permanent magnet unit M is activated at the number of rotations N1 from the initial time 0 until a certain time t1. When the time t1 is reached, the distribution of the thickness of the film deposited on the object to be treated 19 is influenced by the change in the distance between the surface of the target 15 and the object to be treated 19 and in the distance between the permanent magnet unit M and the surface of the target 15, and thereby is worsened to a certain extent, as shown in the left column of FIG. 6.

therefore, the number of rotations of the permanent magnet unit M is changed to the number of rotations N2 by the rotation number control apparatus 7 at this timing (while the uniformity is within an arbitrary allowable range). Consequently, the components of the magnetic fields parallel to the target 15 and right above the target 15 are changed (see FIG. 3), whereby, as a result, the distribution of the film thickness is changed as shown in the right column of FIG. 6, and the uniformity of the film thickness is no longer worsened. Moreover, when the time t2 is reached, the distribution of the thickness of the film deposited on the object to be treated 19 is balanced within an evaluation range, and a good uniformity is achieved. Through this sequence of control, the uniformity of the thickness of the film deposited on the object to be treated 19 is within a range of ±U (arbitrary allowable range) [%] between the beginning and the end of the use of the target 15, thus the yield of the object to be treated is improved more, compared to the case in which the number of rotations is not changed.

Embodiment

Figure 7:
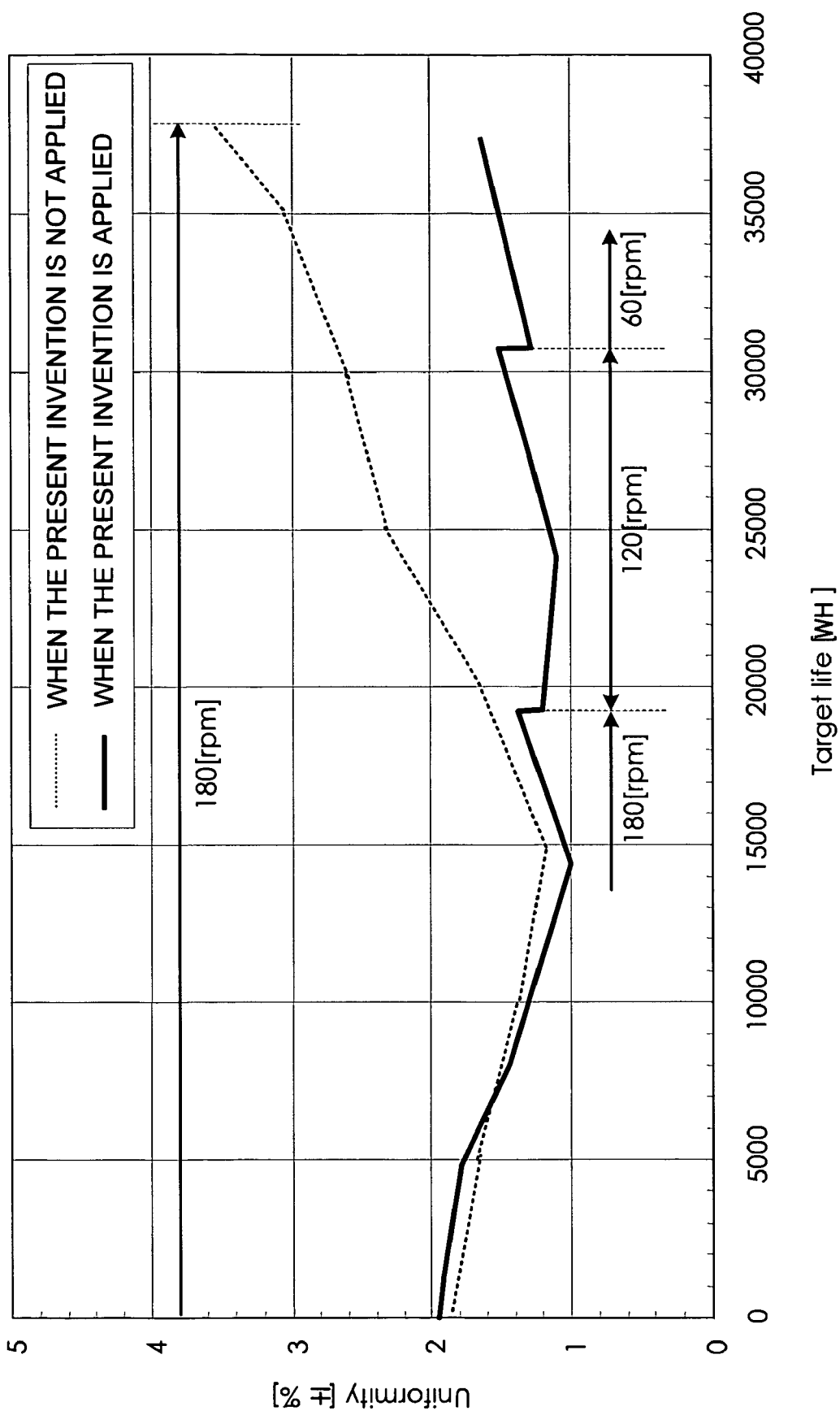
[FIG. 7] An explanatory diagram showing a result of an experiment in which the uniformity of film thickness is measured by using a sputtering apparatus to which the present invention is applied and a sputtering apparatus to which the present invention is not applied.

FIG. 7 shows a result of the experiment based on the present invention described above. In the present experiment, for example, a semi-transparent film is formed on each of material substrates of one-sided/dual layer DVDs, and the uniformity of the semi-transparent film formed on each substrate (MAX−MIN/MAX+MIN)×100[%] is measured with respect to a target life (WH) shown with the power consumption corresponding to an increase in the number of processed substrates.

First of all, in the case where the number of rotations of the target 15 was kept constant at 180 [rpm], which is set as an optimum value in the beginning of the use of the target, without applying the present invention, the distribution exhibited a declining trend upon reaching the target life of 15000 [WH], and increased to ±3 [%] or higher in the vicinity of 35000 [WH]. On the other hand, in the case where the number of rotations of the target 15 was reduced to 120 [rpm] in the vicinity of the target life of 19000 [WH] and further reduced to 60 [rpm] in the vicinity of 31000 [WH], the uniformity fell within a tang of ±1 through 2 [%].

[Effect]

According to the present embodiment described above, even if the distances of the surface of the target 15 to the permanent magnet unit M and to the object to be treated 19 are changed in the beginning and the end of the use of the target 15, the uniformity of the film thickness can be brought close to a constant level and the yield of the object to be treated 19 can be improved by appropriately controlling the number of rotations of the permanent magnet unit M. Particularly, in the present embodiment, a fixed rotation velocity is only gradually switched to other fixed rotation velocity, thus it is not necessary to provide a mechanism for making an adjustment by moving the magnet up and down, to provide a plurality of magnets which rotate individually and a mechanism for making an adjustment for a rotation velocity distribution of each of the rotating many magnets or to provide a complex configuration or adjustment in which the exciting electric power for an electromagnetic coil is adjusted, whereby the apparatus can be simplified and reduction of the costs can be achieved.

Other Embodiment

The present invention is not limited to the above-described embodiment. For example, measurement of the use time or the usage between the beginning and the end of the use of the target is performed by measuring the time after the beginning of the use in the present embodiment, and by measuring the power consumption in this example. However, not only such measurement, but also measurement of the usage of the target may be performed by measuring the weight of the target or measuring the distances using infrared radiation, and the timing for switching may be determined in accordance with the degree of the usage. Specifically, the measurement of the use time or the usage of the target includes direct or indirect measurement of various numerical values which are somewhat proportional to the wear of the target.

The number of times to switch the rotation number or the type of the rotation number to be switched may be switched at least to a different rotation number as described in the above embodiments, or may be switched to different rotation number a plurality of times as described in the above example. A specific value of the number of rotations is also not limited to the one described above. Generally, the number of rotations may be reduced gradually, as described above, but the number of rotations may be gradually increased or the decreased rotation number and the increased rotation number may be combined in accordance with the object to be treated and the target.

Figure 8:
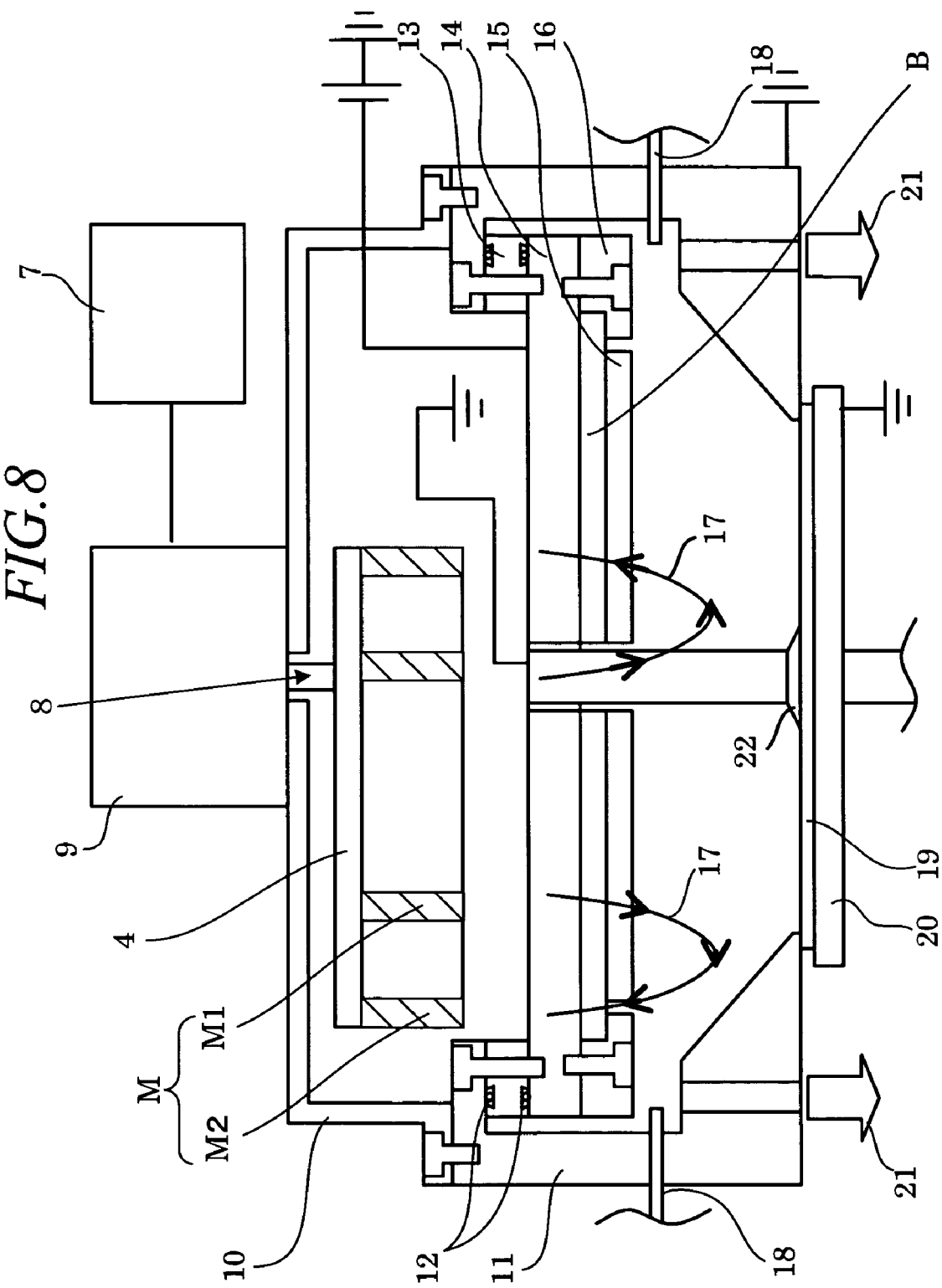
[FIG. 8] A simplified configuration diagram showing an example of other sputtering apparatus to which the present invention can be applied.

Furthermore, each component of the sputtering apparatus is not limited to the one described in the above embodiments, thus various components can be applied in accordance with the type of a target object to be treated. For example, as shown in FIG. 8, each component can be applied to a sputtering apparatus in which a center mask 22 or the like for masking a sputter region is provided in the center of a disk substrate which is the object to be treated 19. Specifically, the type of the object to be treated, which is the target of the present invention, is not limited to a specified one, and thus can be applied to various types which can be the target of film formation using sputtering.

Moreover, the present invention is applied to the sputtering apparatuses disclosed in Japanese Patent Application Laid-Open No. 2002-294446 and Japanese Patent Application Laid-Open No. 2001-262337, but the present invention is not limited to these apparatuses, thus the shape, material, structure and the like of the target, magnet, backing plate, cooling mechanism and the like to be used are arbitrary. For example, regarding the target, various materials which can be used presently or in the future can be applied as long as they can be formed as a film on the object to be treated, by means of magnetron sputtering. Regarding the backing plate, copper or copper alloy is typically used, but as long as the backing plate is made of a material having electric conductivity, any material can be used, and the backing plate may be formed in any shapes. Regarding the magnet, it is preferred to use a permanent magnet from the perspective of simplification of the apparatus and reduction of the costs, but an electric magnet may be employed. Regarding the cooling mechanism, various cooling media or any heat radiation form can be employed.

The invention claimed is:

1. A sputtering apparatus, comprising:
   a replaceable target with a predetermined usage target life which is disposed so as to face an object to be treated;
   a magnet unit which is provided rotatably on the back of the target to generate a high-density plasma by means of a magnetic field generated with rotation, for depositing material from the target on the object to be treated, in the form of a film;
   a rotational mechanism which rotates the magnet unit; and
   a control means for gradually changing a speed of rotations of the magnet unit between an initial installation of a target, at a start of the target life, in the sputtering apparatus to an end of the useful life of the target, wherein the control means includes a computer which provides:
   a drive section which provides a signal for rotably driving the rotational mechanism;
   a detection section which detects a measurement value indicating a current total use time period of the target life from initial start of depositing target material through the operational end of the target life;
   a setting section which stores a plurality of speeds of rotations of the magnet unit, each corresponding to a measurement value of the detection section for different amounts of target life use time from the initial start of depositing target material over the operative service life of the target life;
   a selecting section which selects a measurement value representative of a rotational speed from the setting section, in accordance with the measurement value detected by the detection section; and
   a switching section which instructs the drive section to switch to a speed of rotations selected by the selecting section wherein a predetermined uniform thickness of the target material film is maintained over the entire target life.

2. The sputtering apparatus according to claim 1, wherein in the setting section a slower speed of the rotations is set as the use time of the target elapses or the usage of the target life increases.

3. The sputtering apparatus according to claim 1 further including a timer unit for securing a predetermined expiration of a life-span time period of the target and providing corresponding signals to the control means to gradually change the speed of rotations at predetermined times across the life-span time period of the target to maintain a uniformity of film deposition thickness from the beginning to the end of the target life span.

4. A sputtering apparatus for depositing a film of material on an object comprising:
   a vacuum chamber;
   a target mounted in the vacuum chamber, for providing material to be deposited on the object;
   a magnet unit rotably mounted at a location behind the target to generate a high-density plasma by a magnetic field generated with the rotation of the target for a predetermined number of rotations, to deposit a film of material from the target on the object;
   a rotational mechanism which rotates the magnetic unit; and
   means for maintaining a predetermined film thickness by monitoring a current time period within a target life with a control apparatus using a computer programmed to provide,
   a drive section which provides a drive signal to drive the rotational mechanism;
   a detection section for detecting the amount of usage of the target life and providing a detection signal including a timer for measuring a current time period within a predetermined life-span time period of the target;
   a rotation number setting section for storing one of the plurality of signals representative of rotation numbers to be applied to the magnetic unit at predetermined time periods within the life-span time period of the target life; and
   a selection section for automatically selecting a stored signal representative of a rotation number to be applied to the drive section in response to the detection signal to rotate the magnetic unit to maintain a uniformity of film deposition thickness.

* * * * *